United States Patent
Schrems

[11] Patent Number: 6,040,211
[45] Date of Patent: Mar. 21, 2000

[54] SEMICONDUCTORS HAVING DEFECT DENUDED ZONES

[75] Inventor: Martin Schrems, Langebrueck, Germany

[73] Assignee: Siemens Aktiengesellschaft, Munich, Germany

[21] Appl. No.: 09/093,796

[22] Filed: Jun. 9, 1998

[51] Int. Cl.[7] .............................................. H01L 21/8234
[52] U.S. Cl. ...................... 438/238; 438/795; 438/799; 438/471; 438/386
[58] Field of Search ................................. 438/795, 799, 438/386, 471

[56] References Cited

U.S. PATENT DOCUMENTS

| | | | |
|---|---|---|---|
| 5,466,628 | 11/1995 | Lee et al. ................................. | 437/60 |
| 5,466,631 | 11/1995 | Ichikawa et al. ........................ | 437/62 |
| 5,573,973 | 11/1996 | Sethi et al. .............................. | 437/67 |
| 5,757,063 | 5/1998 | Tomita et al. ........................... | 257/610 |
| 5,786,263 | 7/1998 | Perera ..................................... | 438/431 |
| 5,844,266 | 12/1998 | Stengl et al. ............................ | 257/301 |
| 5,893,735 | 4/1999 | Stengl et al. ............................ | 438/243 |
| 5,939,770 | 8/1999 | Kageyama ............................... | 257/611 |

*Primary Examiner*—Charles Bowers
*Assistant Examiner*—Renzo N. Rocchegiani
*Attorney, Agent, or Firm*—Stanton C. Braden

[57] ABSTRACT

A method for processing a semiconductor substrate to form a denuded zone therein. The method includes providing a semiconductor substrate having an oxygen concentration in a region of the substrate adjacent to a surface of such substrate. A trench is formed in the surface of the substrate. Subsequent to the formation of the trench, reducing the oxygen concentration within the region.

21 Claims, 7 Drawing Sheets

SEMICONDUCTORS HAVING DEFECT DENUDED ZONES

BACKGROUND OF THE INVENTION

This invention relates generally to semiconductors having defect denuded zones (DZs) and more particularly to electronic devices formed in such semiconductors having topography-aligned defect denuded zones.

As is known in the art, Czochralski-grown (CZ) silicon substrates are used today in making semiconductor devices. These CZ-grown silicon substrates typically contain 25–35 parts per million atomic (ppma) of oxygen, virtually all of which is interstitial, i.e., between silicon lattice sites. This oxygen content, which is introduced into the semiconductor material in a process-related manner by the use of quartz workpieces (for example, the crucibles used for Czochralski crystal pulling) is thoroughly desirable because it presents lattice defect nucleation centers for impurities in the crystal lattice. These nucleation centers provide a purification effect, known as "internal gettering", as a result of concentrating the residual impurities. However, this oxygen content is only useful in the interior of the semiconductor wafer. In the surface region of the wafer, i.e., the region where electronic devices are formed, these oxygen centers cause considerable disturbances. More particularly, as a consequence of the processing steps used to form the devices, e.g., epitaxy, dopant treatment, oxidation, and the heat-treatment steps associated therewith, the oxygen centers have a tendency to precipitate formation and consequently cause stresses in the lattice which result, in turn, in the failure of the electronic devices. It is desirable, therefore, to use wafers which contain oxygen-depleted surface zones (i.e., defect denuded zones) which are several $\mu$m thick. Processes for producing a denuded zone (DZ) have been known for a long time. For example, oxygen can be caused to diffuse out of the surface by heat-treating (e.g. annealing) silicon wafers in a furnace (at temperatures, for example, of 1000° C. to 1200° C.) under an inert gas atmosphere. After a time of about five hours at a temperature of 1000° C., the layer thickness of the denuded zone achievable solely by diffusing out oxygen is more than 10 $\mu$m (Huber, D; Reffle, J.: *Solid State Techn.* 26(8), 1983, pages 183). Other methods to produce defect denuded zones including using epitaxial grown layers. In both cases, (i.e., thermal anneal and an epitaxial grown layers), the DZ is basically parallel to the surface of the silicon wafer. Adjacent to the DZ is the defective, oxygen containing, zone having the internal gettering sites produced by the oxygen. The DZ must be sufficiently deep such that the electronic device to be formed later does not extend into the defective zone. On the other hand, the DZ should be as shallow as possible such that the internal gettering sites are close enough to the electronic device in order to provide sufficient gettering efficiency for crystal defects, such as oxygen precipitates, dislocations, stacking faults and contaminants, such as metals like Fe, CU, Ni, Cr, etc., which may be in the device region.

As is also known in the art, one type of electronic device which is formed in the semiconductor is a dynamic random access memory (DRAM). One type of DRAM uses trench capacitors to store charge. A trench capacitor is formed vertically into the surface of the silicon wafer to decrease device surface dimension and thereby increasing integration density as compared to a stack capacitor. A typical trench capacitor can be up to 7–8 $\mu$m deep. In order to avoid degeneration of device performance, or complete device failure, the whole area near the wafer surface containing both transistors and trench capacitors must be kept virtually free of the aforementioned crystal defects.

As is also known in the art, with current technology used to form DZs essentially parallel to the wafer surface, the rate of oxygen precipitation is not completely uniform across the wafer. The local DZ depths for different sites on one wafer, as well as from wafer-to-wafer, are statistically distributed. More particularly, the initial oxygen concentration is typically higher near the edges of the wafer than near the center of the wafer. If, for example, the DZ depth is chosen as 10 $\mu$m to accommodate an 8 $\mu$m trench capacitor, at some positions on the wafer, especially near the wafer edge, the DZ will, with high probability, be less than 8 $\mu$m. This can either result in spikes during reactive ion etching (RIE) of the trench structure or in defect formation near the trench leading to a degradation of the node dielectric (i.e., the dielectric lining the walls of the trench and disposed between the doped polycrystalline silicon in the trench to form one electrode, or plate, for the capacitor, and the doped region in the silicon substrate separated by the dielectric lining the trench used to form the second electrode of the capacitor). If defects, such as oxygen precipitates and dislocation loops, are located too close to a charged trench capacitor, charge leakage can occur leading to significant degradation of retention time for charge in the DRAM cell trench capacitor.

Further, a relatively large thermal budget (i.e., high temperature and long anneal time) is required for formation of a DZ in a CZ wafer by a high temperature out-diffusion step according to current technology. For example, for a CZ wafer having an initial interstitial oxygen concentration of about 30 ppma, the forming of a DZ with a depth of about 10 $\mu$m requires a heat treatment of about one hour at 1150° C., while forming a DZ with a depth of about 20 $\mu$m requires at least about four to five hours at 1150° C. Still further, because interstitial oxygen concentration monotonously increases with depth from the surface, the number of oxygen micro-precipitates, which can also degrade device performance if located too closely to electronic devices such as transistors or capacitors, also increases with depth. In other words, the quality of the DZ decreases with increasing depth from the wafer surface.

The quality of the first few microns of the DZ is predominately a result of the surface condition during the thermal treatment for DZ formation. Annealing in hydrogen, or an inert atmosphere (at longer anneal times) can result in oxygen concentrations at the wafer surface below 1 ppma. A typical process used is to perform an anneal in pure hydrogen for one hour at 1200° C. resulting in a DZ depth of about 20 $\mu$m; however, the cost of this process can be relatively high. One method of forming a high quality DZ irrespective of the depth from the surface is growing an epitaxial silicon layer on the DZ silicon surface, such as a p⁻-type conductivity epitaxial layer on a p-type silicon substrate, or an n⁻-type epitaxial layer on an n-type silicon substrate. In the epitaxial layer, the total concentration of oxygen will be typically below 2 ppma compared to typically 30 ppma in non-annealed CZ silicon substrates. Because of the high cost of manufacturing wafers with epitaxial layers with more than 2–3 $\mu$m thickness, such wafers are rarely used in device production. The additional cost for producing epitaxial layered wafers for thickness as small as 2–3 $\mu$m is still relatively high compared to conventional CZ wafers. In this case, however, oxygen from CZ substrates will diffuse into the epitaxial layer during device manufacturing processes such that the quality of the DZ near the wafer surface will not be noticeably better than that of, for example, a hydrogen annealed wafer. Further, the thicker the epitaxial layer the further the gettering sites move away from the device active region. That is, it is desired that the getting sites in the epitaxial layer be just below the active region where the active devices are formed. The thicker the epitaxial layer, however, the further the gettering sites move away from the active region. Also, the thick epitaxial layer is more susceptible to dislocations propagation and this leads to reduced yield if the epitaxial layer is too thick.

SUMMARY OF THE INVENTION

In accordance with the present invention, a method is provided for processing a semiconductor substrate to form a denuded zone therein. The method includes providing a semiconductor substrate having an oxygen concentration in a region of the substrate adjacent to a surface of such substrate. A trench is formed in the surface of the substrate with sidewalls of the trench passing through the oxygen concentration region and a bottom portion of the trench terminating in the oxygen concentration region. Subsequent to the formation of the trench, the sidewalls and bottom portion of the trench are processed to reduce the oxygen concentration within the region adjacent to such sidewalls and bottom portion and form a denuded zone about the sidewalls and bottom portion of the trench.

With such method, the sidewalls and bottom portion of the trench are exposed to the oxygen reduction process to thereby forming a denuded zone directly adjacent to (i.e., contiguous to) such sidewalls and bottom portion thereby producing a topography aligned DZ (i.e., the DZ follows the profile of the trench).

In accordance with another feature of the invention, the reducing step comprises heating the substrate to reduce the oxygen concentration within the region.

In accordance with another feature of the invention, a method is provided for processing a semiconductor substrate to form a denuded zone therein. The method includes providing a semiconductor substrate having an epitaxial layer disposed on a surface of the substrate and such substrate having an oxygen concentration in a region of the substrate adjacent to the surface of such substrate. A trench is formed in the surface of the substrate. Subsequent to the formation of the trench, the oxygen concentration is reduced within the region.

In accordance with another feature of the invention, a method is provided for processing a semiconductor substrate to form a denuded zone therein. The method includes providing a semiconductor substrate having an oxygen concentration in a region of the substrate adjacent to a surface of such substrate. The oxygen concentration is reduced within a first portion of the region, such first portion of the region being disposed contiguous to the substrate. A trench is formed in the surface of the substrate. Subsequent to the formation of the trench, reducing the oxygen concentration within a portion of the region disposed beneath a bottom portion of the trench.

BRIEF DESCRIPTION OF THE DRAWING

These and other features of the invention will become more readily apparent when read together with the following detailed description taken together with the accompanying drawings, in which.

DETAILED DESCRIPTION OF THE PREFERRED EMBODIMENTS

Figure 1A:
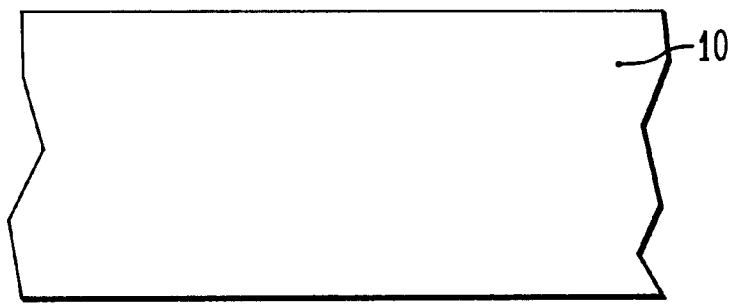
FIGS. 1A to 1C are diagrammatical cross-sectional sketches of a semiconductor substrate having oxygen concentration therein at various steps in the manufacture thereof to form a trench with a denuded zone about such trench in accordance with one embodiment of the invention.

Referring now to FIG. 1A, a semiconductor substrate 10, here a silicon substrate formed from a Czochralski-grown silicon wafer, is shown. It is noted that the substrate 10 has an oxygen concentration in a region of the substrate adjacent to the upper surface of such substrate.

Figure 1B:
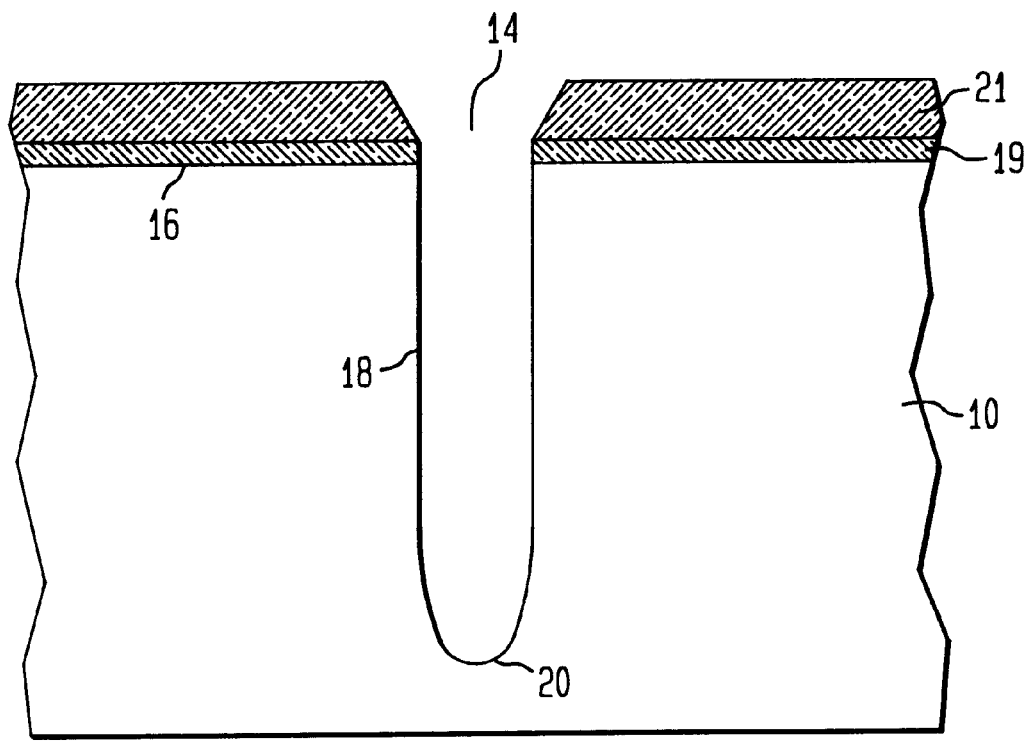

Next, a trench 14, as shown in FIG. 1B, is etched into the upper surface 16 of the substrate 10 using any conventional photolithographic and deep trench etch processes. It is noted that the trench 14 has sidewalls 18 which pass through the oxygen concentration region and bottom portions 20 which terminate in the oxygen concentration region. Here, the bottom portion 20 of the trench 14 is at a depth e.g., 7–8 $\mu$m from the upper surface 16 of the substrate 10.

More particularly, using conventional processing, a silicon dioxide (i.e., pad oxide) layer 19 is formed over the surface of the silicon substrate 10. A pad silicon nitride layer 21 is then formed over the silicon dioxide layer 19. A hard mask, not shown (such as BSG or TEOS), is deposited over the silicon nitride layer 21. An anti-reflection coating (ARC), not shown, is formed over the hard mask. A photoresist, not shown, is applied over the ARC and patterned lithographically to form opening where the trench 14 is to be etched. The trench is then etched into the hard mask, and the photoresist layer is then stripped. The etched hard mask is used as a mask to enable etching of the trench 14 into the silicon 10. The hard mask is then stripped using a wet etch. The resulting structure is shown in FIG. 1B.

Figure 1C:
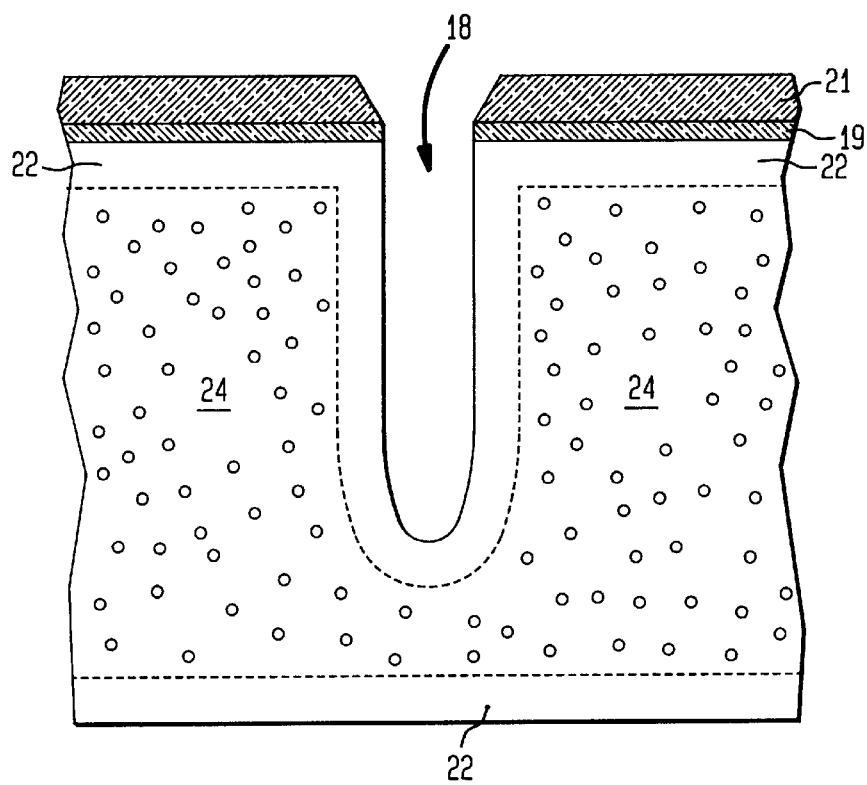

Next, that is after the formation of the trench 14, the structure is processed to form a defect denuded zone 22 and a defect region 24 to provide internal gettering. That is, the sidewalls 18 and bottom portion 20 of the trench 14 are processed to reduce the oxygen concentration within the DZ region 22 adjacent to such sidewalls 18 and bottom portion 20 and, as noted in FIG. 1C, the DZ 22 is disposed contiguous to the sidewalls 18 and bottom portion 20 of the trench 14 with the defect region 24 disposed adjacent to the DZ 22. That is, the denuded zone 22 is disposed about the sidewalls 18 and bottom portion 20 of the trench 14. With such method, the sidewalls 18 and bottom portion 20 of the trenches 14 are exposed to the oxygen reduction process to thereby forming the denuded zone (DZ) 22 directly adjacent to (i.e., contiguous to) such sidewalls 18 and bottom portion 20 thereby producing a topography aligned DZ 22 (i.e., the DZ 22 follows the profile of the trench).

More particularly, here the substrate 10 is heated at a temperature of 1000° C. for 30 minutes in a hydrogen or nitrogen or argon atmosphere using a batch furnace with conventional or preferably fast thermal process with ramp rates of, for example, 70° C. per minute to produce a DZ 22 of about 3–5 μm. Another example is using a typical single wafer rapid thermal process (RTP) sequence such as 1100° C.–1200° C. per two minutes in argon, hydrogen, or nitrogen. Any other DZ 22 producing process may be used. In any event, it is noted that because the sidewalls 18 and bottom portion 20 of the trenches 14 are directly exposed to the heating process, the DZ 22 is formed along (i.e., contiguous to) the sidewalls 18 and bottom portions 22 thereby providing the following advantages: (1) Cost reduction due to lower thermal budget DZ 22 formation process, i.e., shorter anneal time, lower temperature, enhanced surface area compared to wafers 10 with the trench 14 formation); (2) Topography-aligned DZ 22 and thus high quality defect free DZs 22 even in the bottom portion of the trench 14; better node dielectric reliability, reduced charge leakage from the trench 14 (which is especially important for thin node dielectrics (<5 nm thickness); the anneal after trench etching both removes contaminates and damage from etching and out-diffuses oxygen resulting in an elimination of oxygen related micro-defects at the trench surface where the node dielectric is to be formed later); and, (3) More efficient internal gettering because gettering sites are closer (but still sufficient) distance from the active devices, such as transistors; and, especially better gate oxide integrity.

Figure 1D:
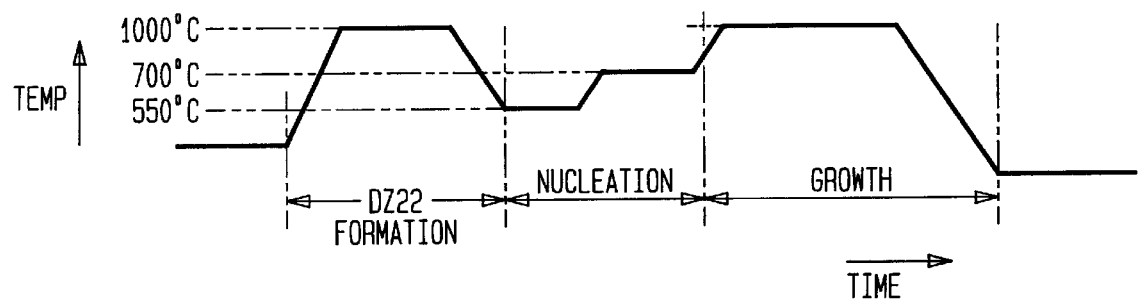
FIG. 1D is a temperature vs. time profile of a process may be used to form a denuded zone in accordance with the invention.

As noted above, the formation of the DZ 22 may be performed by heating the structure at a temperature of 1000° C. for 30 minutes in a hydrogen or nitrogen or argon atmosphere using a batch furnace with conventional or preferably fast thermal process with ramp rates of, for example, 70° C. per minute to produce a DZ 22 of about 3–5 μm. After such DZ 22 formation, precipitate nucleation and growth anneal may be performed in the same furnace. Thus, referring to FIG. 1D, a temperature vs. time profile is shown. That is, after DZ 22 formation, a two, or multi-step anneal can be performed to first nucleate oxygen precipitates at a lower temperature, such as below 800° C. and subsequently grow the oxygen precipitates at higher temperatures such as 1000° C.

First, the DZ 22 is formed by ramping the furnace temperature to 1000° C. at a ramp rate of 50° C. per minute. The temperature is maintained at 1000° C. for 30 minutes. The structure then is processed to perform an oxygen precipitate nucleation. More particularly, the temperature of the furnace is then lowered to 550° C. for 60 minutes and then raised to 700° C. at a rate of 5–10° C. per minute. Next, a precipitate growth process is performed where the temperature of the furnace is raised from 700° C. to 1000° C. for 1–5 hours at a ramp rate of 5–10° C. per minute. Optionally, precipitates may be formed automatically during subsequent deposition and anneal/oxidation or nitrogenation steps.

Figure 2:
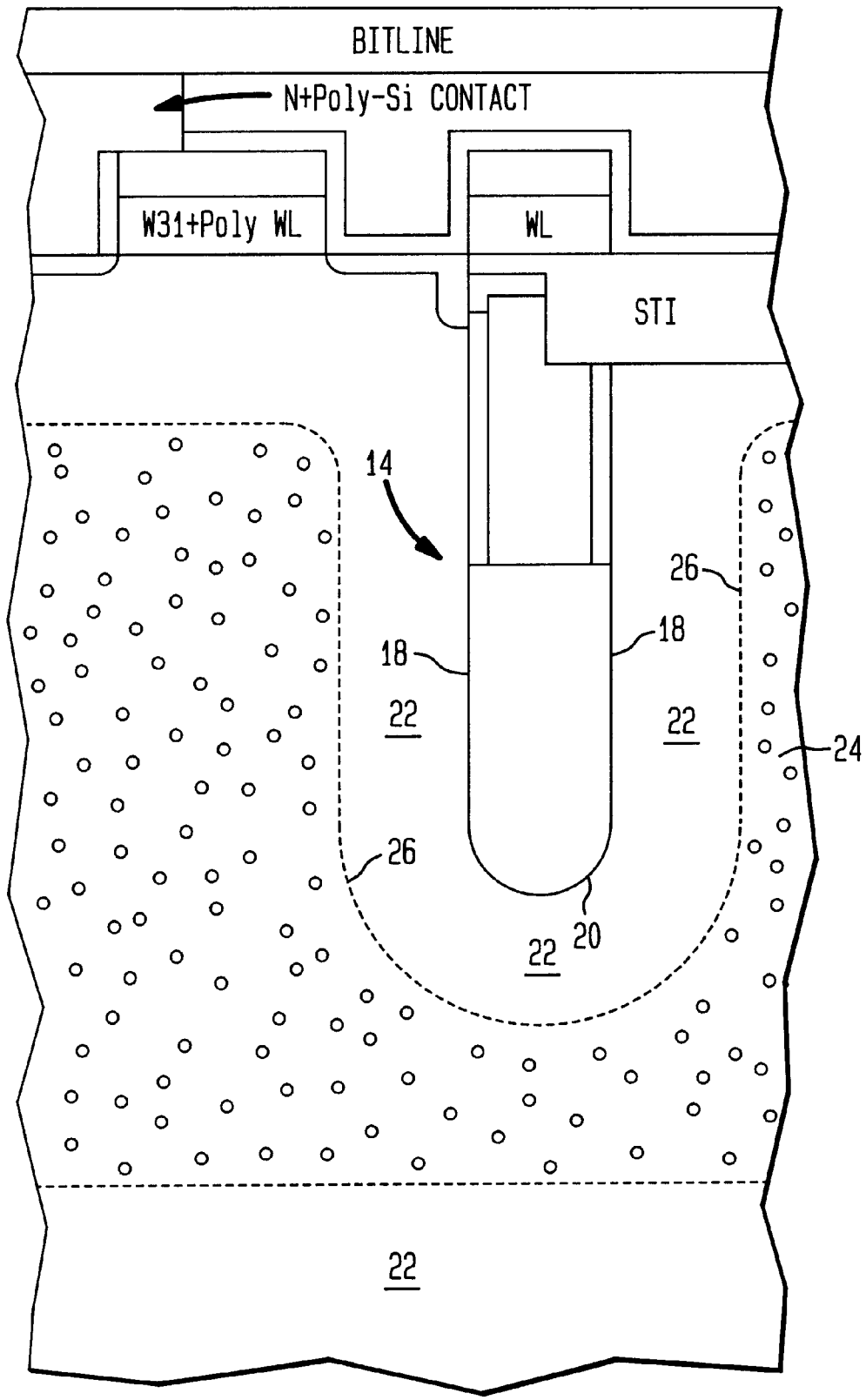
FIG. 2 is a diagrammatical cross-sectional sketch of a DRAM cell having a trench capacitor, such cell having a denuded zone around the capacitor, such zone being formed in accordance with the invention.

The structure is then processed in any conventional manner to form a trench capacitor DRAM cell, for example, as shown in FIG. 2 with the boundary between the DZ 22 and the defect region 24 being indicated by the dotted line 26.

Figure 3A:
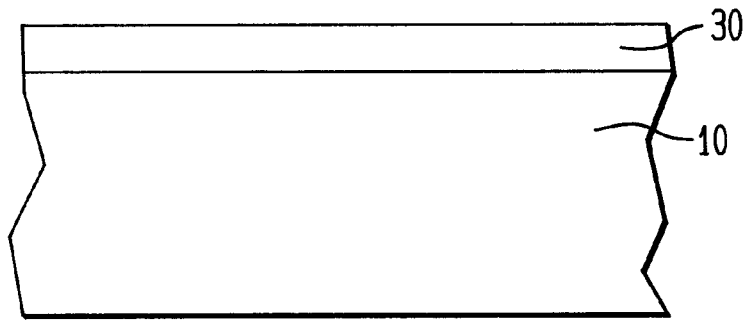
FIGS. 3A to 3C are diagrammatical cross-sectional sketches of a semiconductor substrate having oxygen concentration therein at various steps in the manufacture thereof to form a trench with a denuded zone about such trench in accordance with another embodiment of the invention.

Referring now to FIG. 3A, here a CZ substrate 10 such as the substrate 10 shown in FIG. 1A is provided. Here, however, the substrate 10 has an epitaxial layer 30 formed on the upper surface 16 thereof. Here, the epitaxial layer 30 is formed with a thickness of 0.5–3 μm and which contains less than 1 ppma of oxygen and thus provides a shallow DZ of high quality (i.e., superior gate oxide integrity).

Figure 3B:
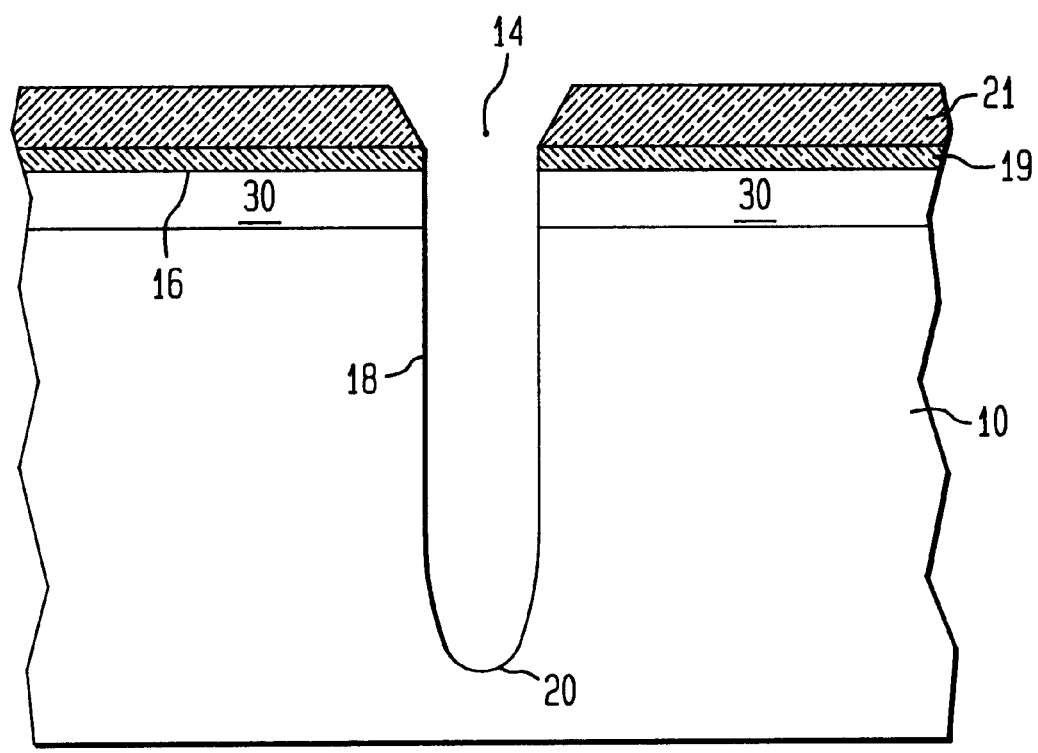

Next, the trench 14, as shown in FIG. 3B, is etched through the epitaxial layer 30 and into the upper surface 16 of the substrate 10 using any conventional photolithographic process described above in connection with FIGS. 1A–1C. It is noted that the trench 14 again has sidewalls 18 which pass through the oxygen concentration region and bottom portion 20 which terminate in the oxygen concentration region. Here, again the bottom 20 of the trench 14 is at a depth 7–8 μm from the upper surface 16 of the substrate 10.

Figure 3C:
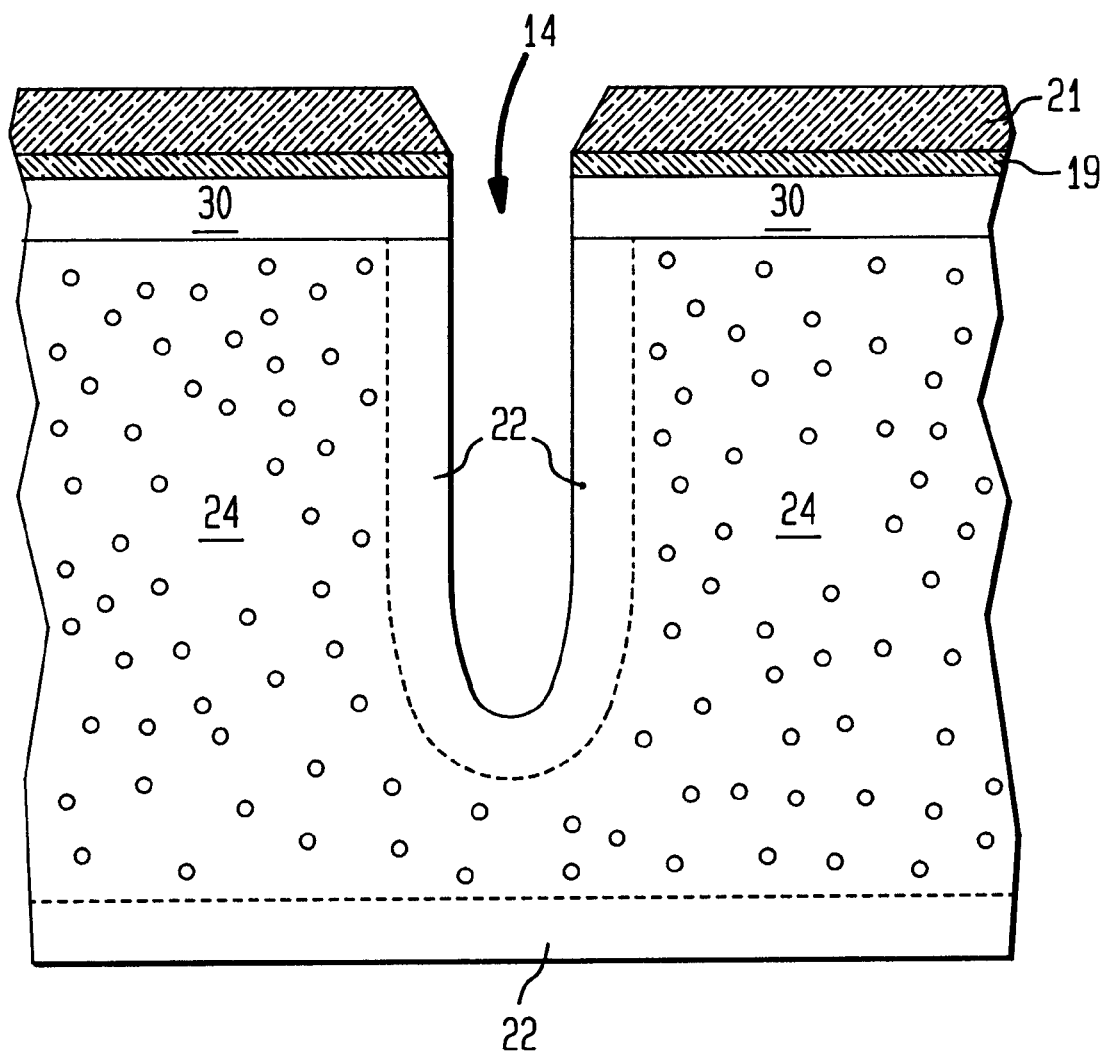

Next, that is after the formation of the trench 14, the structure is processed to form a defect denuded zone 22 and a defect region 24 to provide internal gettering. That is, the sidewalls 18 and bottom portion 20 of the trench 14 is processed to reduce the oxygen concentration within the region adjacent to such sidewalls 18 and bottom portion 20 and, as noted in FIG. 3C, the DZ 22 is disposed contiguous to the sidewalls 18 and bottom portion 20 of the trench 14 with the defect region 24 disposed adjacent to the DZ 22 (the boundary between the DZ 22 and the region 24 being indicated by the dotted line 26). It is noted that use of a hydrogen pre-treatment at high temperatures required to remove native oxide before the epitaxial layer 16 deposition forms the additional DZ in the CZ substrate 10 and dissolves small oxygen precipitates which would otherwise grow at later processing steps and could lead to spikes in the trench etching.

Figure 4A:
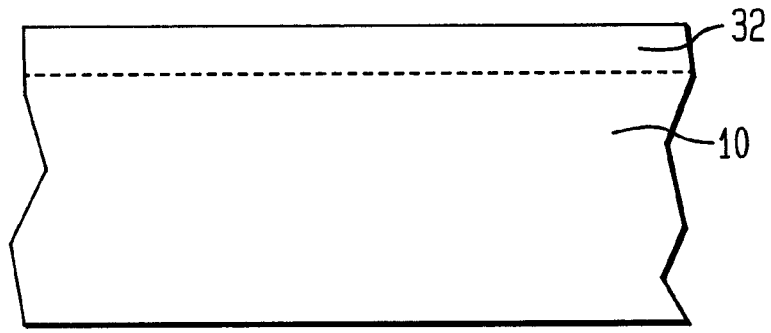
FIGS. 4A to 4C are diagrammatical cross-sectional sketches of a semiconductor substrate having oxygen concentration therein at various steps in the manufacture thereof to form a trench with a denuded zone about such trench in accordance with another embodiment of the invention.

Referring now to FIG. 4A, here a CZ substrate 10 such as the substrate 10 shown in FIG. 1A is provided. Here, however, the substrate 10 is processed to form a shallow DZ 32 along the upper surface 16 thereof. For example, an anneal in nitrogen or oxygen such as 1000° C. for 30 minutes using a ramp rate of 20–100° C. per minute. A temperature of 1100° C. for 30 minutes may also be sufficient to create a shallow DZ 32 but an anneal in hydrogen or argon will lead to a lower oxygen concentration near the substrate 10 surface 16 and to a better gate oxide integrity. This first denuding anneal has a similar effect on avoiding spike formation in trench etching if it is performed in a hydrogen or argon ambient and is significantly less expensive than using an epitaxial layer 30 (FIGS. 3A–3D). Furthermore, it eliminates the danger of dislocation formation at the interface between the epitaxial silicon layer 30 and the substrate 10.

Figure 4B:
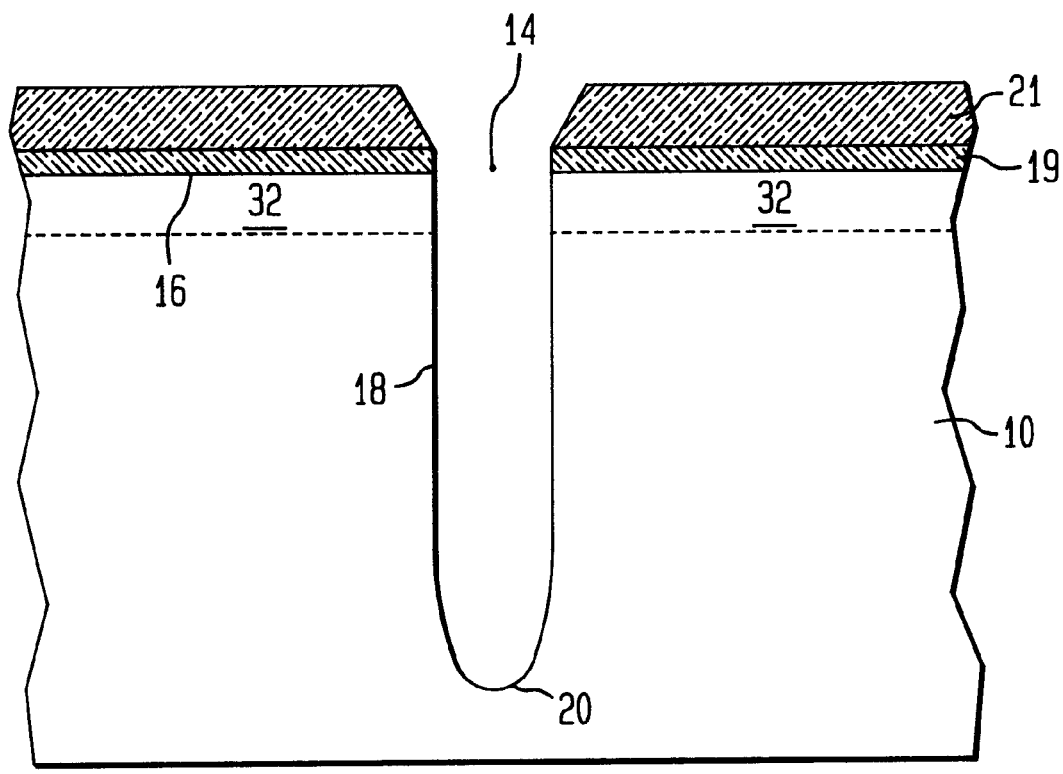

Next, the trench 14, as shown in FIG. 4B, is etched through the first, shallow DZ 36 and into the underlying portion of the substrate 10 using any conventional photolithographic process described above in connection with FIGS. 1A–1C. It is noted that the trench 14 again has sidewalls 18 which pass through the oxygen concentration region of substrate 10 and bottom portion 20 which terminate in the oxygen concentration region. Here, again the bottom 20 of the trench 14 is at a depth 7–8 μm from the upper surface 16 of the substrate 10.

Figure 4C:
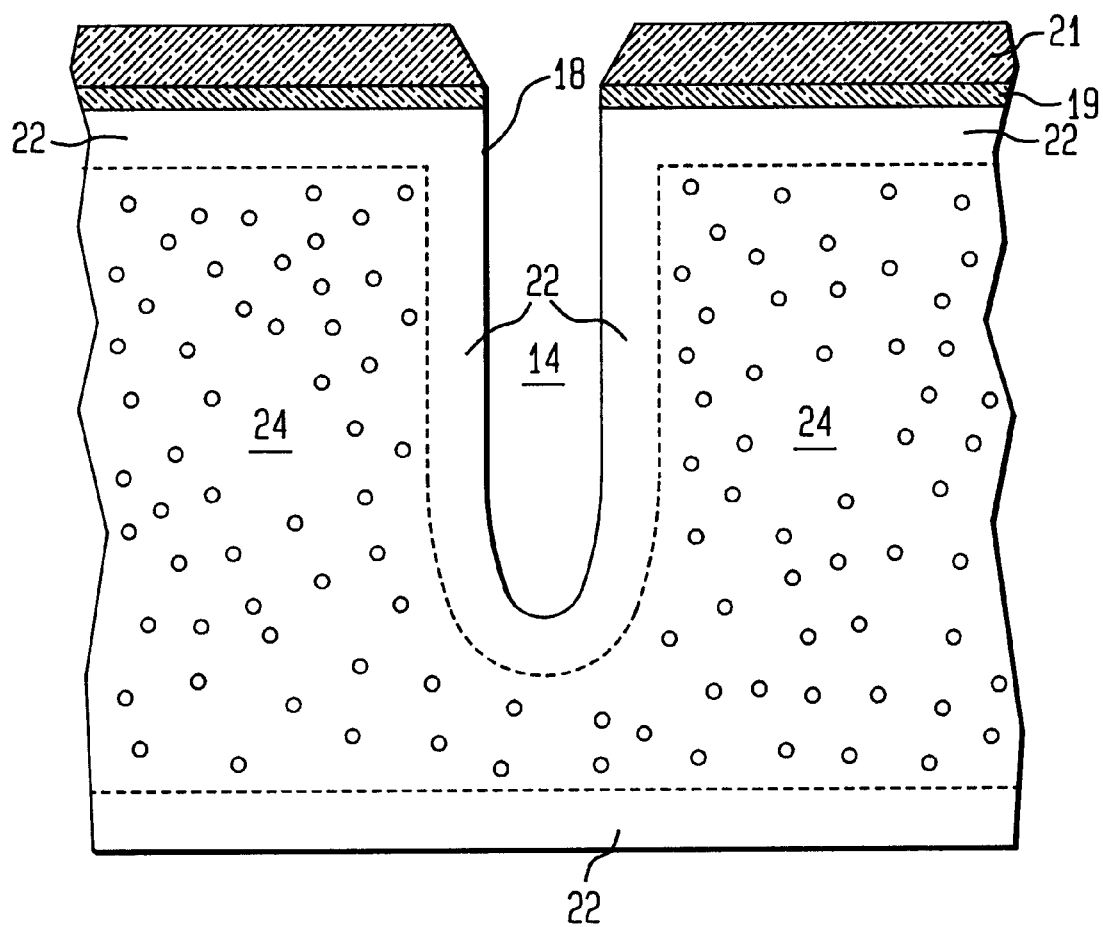

Next, that is after the formation of the trench 14, the structure is processed to form a second defect denuded zone 22 and a defect region 24 to provide internal gettering. That is, the sidewalls 18 and bottom portion 20 of the trench 14 is processed to reduce the oxygen concentration within the DZ 22 adjacent to such sidewalls 18 and bottom portion 20 and, as noted in FIG. 4C, the DZ 22 is disposed contiguous to the sidewalls 18 and bottom portion 20 of the trench 14 with the defect region 24 disposed adjacent to the DZ 22, the boundary therebetween being indicated by the dotted line 26.

It is noted that in the case of the anneal performed after the trench 14 formation, theses anneals will also remove damage and contamination from trench etching. Therefore, ambients such as hydrogen or argon are preferred to ambients such as nitrogen or oxygen which would not remove native oxides and contamination.

Other embodiments are within the spirit and scope of the appended claims. For example, with continuing reduction of the thermal budget in fabricating modern devices, the thermal processing steps may not be sufficient to grow sufficient number of precipitates for effective internal gettering. Thus, the precipitate nucleation steps may be at a temperature of 550° C. for an hour followed by a temperature of 700° C. for an hour. The growth step may then follow at a temperature of 1000° C. for 3 hours in nitrogen. Further, with the optional precipitate nucleation and growth, or alternatively, by performing the nucleating and growing the precipitates during subsequent thermal processing in device manufacturing, a trench capacitor DRAM cell with topography aligned denuded zone is achieved after finishing the cell according to conventional processing.

What is claimed is:

1. A method for processing a semiconductor substrate having an oxygen concentration in a region of the substrate adjacent to a surface of such substrate, comprising:

forming a trench in the surface of the substrate; and subsequent to the formation of the trench, reducing the oxygen concentration within the region.

2. The method recited in claim 1 including the reducing step comprises heating the substrate to reduce the oxygen concentration within the region.

3. The method recited in claim 2 wherein the trench forming step comprises forming the trench through the region and wherein the reducing step comprises reducing the oxygen concentration in a portion of the region below a bottom portion of the trench.

4. The method recited in claim 3 including the reducing step comprises heating the substrate to reduce the oxygen concentration within the portion of the region below the bottom portion of the trench.

5. The method recited in claim 1 including forming an epitaxial layer prior to the formation of the trench.

6. The method recited in claim 2 including forming an epitaxial layer prior to the formation of the trench.

7. The method recited in claim 3 including forming an epitaxial layer prior to the formation of the trench.

8. The method recited in claim 4 including forming an epitaxial layer prior to the formation of the trench.

9. The method recited in claim 1 including, additionally, reducing the oxygen concentration within a first portion of the region prior to formation of the trench, such first portion of the region being disposed contiguous to the substrate and wherein the first-mentioned reduction of the oxygen is in a portion of the region disposed beneath a bottom portion of the trench.

10. The method recited in claim 9 including the reducing step comprises heating the substrate to reduce the oxygen concentration within the region.

11. The method recited in claim 10 wherein the trench forming step comprises forming the trench through the region and wherein the reducing step comprises reducing the oxygen concentration in a portion of the region below a bottom portion of the trench.

12. The method recited in claim 11 including the reducing step comprises heating the substrate to reduce the oxygen concentration within the portion of the region below the bottom portion of the trench.

13. The method recited in claim 9 including forming an epitaxial layer prior to the formation of the trench.

14. The method recited in claim 10 including forming an epitaxial layer prior to the formation of the trench.

15. The method recited in claim 11 including forming an epitaxial layer prior to the formation of the trench.

16. The method recited in claim 12 including forming an epitaxial layer prior to the formation of the trench.

17. A method for processing a semiconductor substrate to form a denuded zone therein, such method comprising:

providing a semiconductor substrate having an oxygen concentration in a region of the substrate adjacent to a surface of such substrate;

forming a trench in the surface of the substrate with sidewalls of the trench passing through the oxygen concentration region and a bottom portion of the trench terminating in the oxygen concentration region; and subsequent to the formation of the trench, processing the sidewalls and bottom portion of the trench to reduce the oxygen concentration within the region adjacent to such sidewalls and bottom portion.

18. The method recited in claim 17 including the reducing step comprises heating the substrate to reduce the oxygen concentration within the region.

19. The method recited in claim 17 including forming an epitaxial layer prior to the formation of the trench.

20. The method recited in claim 18 including forming an epitaxial layer prior to the formation of the trench.

21. The method recited in claim 17 including, additionally, reducing the oxygen concentration within a first portion of the region prior to formation of the trench, such first portion of the region being disposed contiguous to the substrate and wherein the first-mentioned reduction of the oxygen is in a portion of the region disposed beneath a bottom portion of the trench.

* * * * *